(12) United States Patent
Rangavajjhala et al.

(10) Patent No.: US 9,559,987 B1
(45) Date of Patent: Jan. 31, 2017

(54) METHOD AND APPARATUS FOR IMPROVING CAM LEARN THROUGHPUT USING A CACHE

(75) Inventors: Venkata Rangavajjhala, Fremont, CA (US); Marc A. Schaub, Sunnyvale, CA (US)

(73) Assignee: Tellabs Operations, Inc, Naperville, IL (US)

( * ) Notice: Subject to any disclaimer, the term of this patent is extended or adjusted under 35 U.S.C. 154(b) by 1346 days.

(21) Appl. No.: 12/239,084

(22) Filed: Sep. 26, 2008

(51) Int. Cl.
*H04L 12/28* (2006.01)
*G06F 13/28* (2006.01)
*H04L 12/935* (2013.01)
*G11C 15/00* (2006.01)

(52) U.S. Cl.
CPC .......... *H04L 49/3009* (2013.01); *G11C 15/00* (2013.01)

(58) Field of Classification Search
USPC ................................. 370/400, 401; 711/108
See application file for complete search history.

(56) References Cited

U.S. PATENT DOCUMENTS

| | | | | |
|---|---|---|---|---|
| 5,195,097 A * | 3/1993 | Bogholtz et al. | ............ | 714/743 |
| 5,339,268 A * | 8/1994 | Machida | ................ | G11C 15/00 365/189.05 |
| 5,740,175 A * | 4/1998 | Wakeman et al. | ............ | 370/422 |
| 6,041,405 A * | 3/2000 | Green | ........................... | 712/213 |
| 6,125,441 A * | 9/2000 | Green | ........................... | 712/210 |
| 6,772,279 B1 * | 8/2004 | Sun et al. | ..................... | 711/108 |
| 6,865,185 B1 * | 3/2005 | Patel | ....................... | H04L 47/12 370/310 |
| 7,185,172 B1 * | 2/2007 | Mick, Jr. | ........... | G06F 17/30982 707/E17.035 |
| 7,194,573 B1 * | 3/2007 | Saxtorph | ................ | G11C 15/00 711/100 |
| 7,203,740 B1 * | 4/2007 | Putzolu | .................... | H04L 29/06 709/217 |
| 7,215,638 B1 * | 5/2007 | Roberts | ............... | H04L 65/1069 370/230 |
| 7,359,984 B1 * | 4/2008 | Hackney | ............. | H04L 12/2854 370/229 |
| 7,436,494 B1 * | 10/2008 | Kennedy et al. | ............ | 356/4.01 |
| 2001/0043614 A1 * | 11/2001 | Viswanadham et al. | ..... | 370/469 |
| 2003/0227290 A1 * | 12/2003 | Parker | ........................... | 324/536 |
| 2005/0152335 A1 * | 7/2005 | Lodha | ..................... | H04L 45/38 370/351 |
| 2005/0193234 A1 * | 9/2005 | Wu et al. | .......................... | 714/6 |
| 2006/0092934 A1 * | 5/2006 | Chung et al. | .................. | 370/389 |
| 2007/0113158 A1 * | 5/2007 | Fischer | .................. | G11C 15/00 714/777 |
| 2008/0239778 A1 * | 10/2008 | Shastry | .................. | G11C 15/04 365/49.17 |

\* cited by examiner

*Primary Examiner* — Marsha D Banks Harold
*Assistant Examiner* — Christopher Wyllie
(74) *Attorney, Agent, or Firm* — James M. Wu; JW Law Group

(57) ABSTRACT

An apparatus and method of using a cache to improve a learn rate for a content-addressable memory ("CAM") are disclosed. A network device such as a router or a switch, in one embodiment, includes a key generator, a searching circuit, and a key cache, wherein the key generator is capable of generating a first lookup key in response to a first packet. The searching circuit is configured to search the content of the CAM to match the first lookup key. If the first lookup key is not found in the CAM, the key cache stores the first lookup key in response to a first miss.

20 Claims, 4 Drawing Sheets

METHOD AND APPARATUS FOR IMPROVING CAM LEARN THROUGHPUT USING A CACHE

FIELD

The exemplary embodiment(s) of the present invention relates to communications network. More specifically, the exemplary embodiment(s) of the present invention relates to network devices such as network routers or switches.

BACKGROUND

A high-speed network environment typically includes network devices such as routers and switches that facilitate delivery of information packets from source devices to destination devices. Information pertaining to the transfer of packet(s) through the network is usually embedded within one or more packets. Each packet traveling through a network can typically be treated independently from other packets in a packet stream. For example, each router within a network processes incoming packets and determines where the packet(s) should be forwarded. In a high-speed computing network environment, the speed of packet processing or routing can be critical in determining the performance of over all network system.

In order to determine the action to be performed on an incoming packet, a router needs to classify a packet based on information contained in the packet. Typical routers employ content-addressable memories (CAMs) to perform the classification step of packet processing at relatively high rates. Every incoming packet is parsed and the control information contained within the packet is used to create a key, which is used to look up the contents of the CAM. If a valid entry is present in the CAM for that key, the corresponding result can be used to classify the packet. When no valid entry is present, it is indicative of a new flow of packets. A packet flow or flow of packet or flow is a packet stream traveling from a given source and a given destination. New packet flows are constantly being created at various source devices, based on user applications. The router, for example, typically needs to learn new flows based on the first packet of the flow being detected. In order to develop the capability to quickly process future packets belonging to the same flow, the router needs to learn the flow. A process of learning a new flow or a learning process is usually slow and can be one of the choke points in a high-speed router.

A problem associated with a CAM learn request is that in a high speed network element, it is possible that multiple CAM learn requests can happen within the CAM accessing latency period. When two or more CAM learn requests are created due to the same flow, duplicated CAM entries for a single flow may occur. For example, two consecutive flows or packets having the similar source addresses, destination addresses and similar data types could be leaned twice by CAM. A conventional approach to address this issue is to throttle the learn requests to be less than or equal to the CAM access speed, which however compromises the performance of router.

SUMMARY

An apparatus and a method of using a cache to improve a learn rate for a content-addressable memory ("CAM") are disclosed. A network device such as a network router or switch includes a key generator, a searching unit, and a key cache, wherein the key generator is capable of generating a first lookup key in response to a first packet. While the searching unit is configured to search the content of CAM to match the lookup key, the key cache is capable of storing the first lookup key in response to a first miss. The signal of the first miss indicates that CAM does not have a result for the first lookup key. The network device, in one embodiment, further includes a comparing circuit and a learn circuit. After generating a second lookup key in accordance with a second packet, the comparing circuit, for example, compares the first lookup key stored in the cache and the second lookup key in response to a second miss. When the content of the key cache does not match with the second lookup key, the learn circuit issues a search and learn ("S&L") command establishing an entry in CAM for the second lookup key.

Additional features and benefits of the exemplary embodiment(s) of the present invention will become apparent from the detailed description, figures and claims set forth below.

BRIEF DESCRIPTION OF THE DRAWINGS

The exemplary embodiment(s) of the present invention will be understood more fully from the detailed description given below and from the accompanying drawings of various embodiments of the invention, which, however, should not be taken to limit the invention to the specific embodiments, but are for explanation and understanding only.

DETAILED DESCRIPTION

Figure 1:
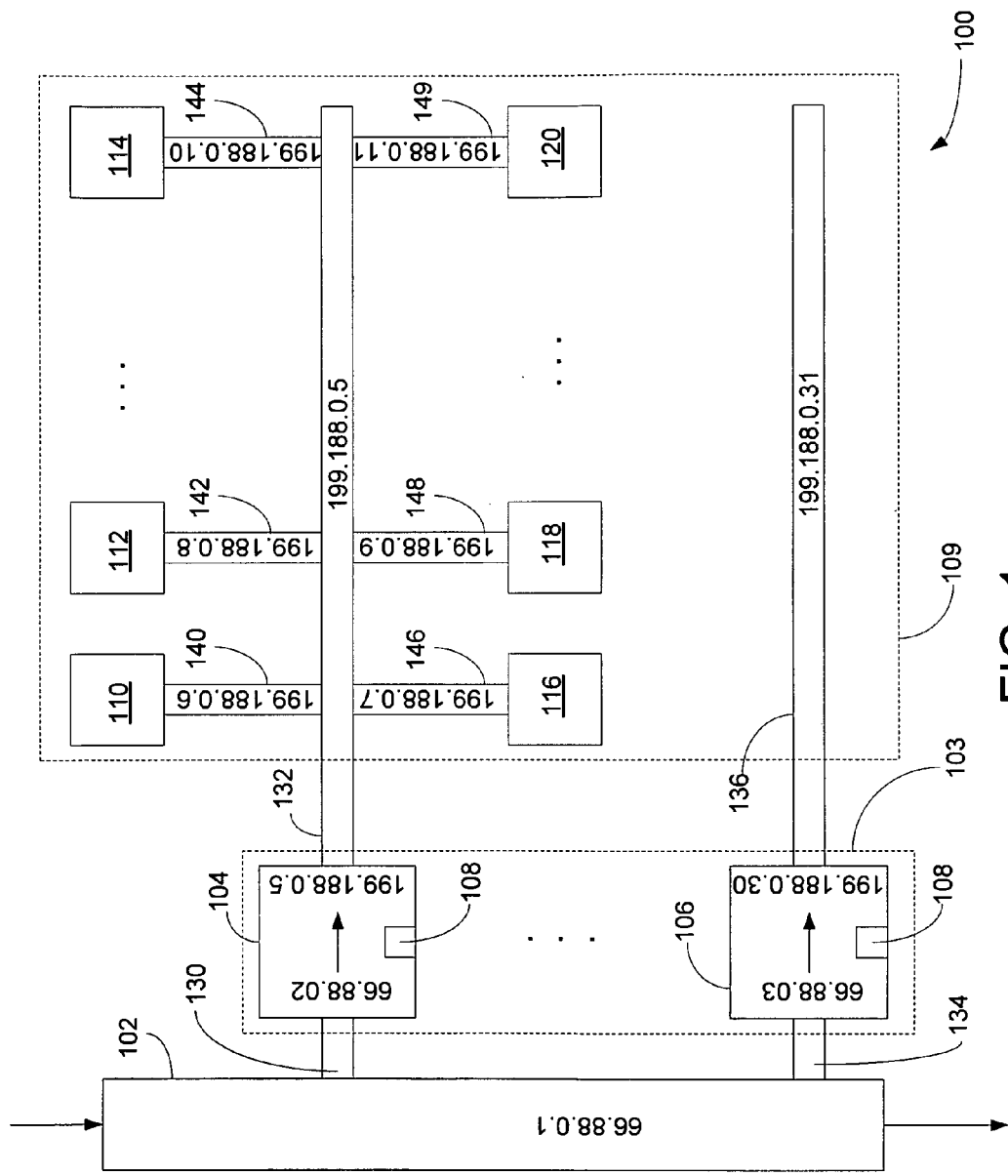
FIG. 1 is a block diagram illustrating a network routing device having a cache to improve CAM learn rate in accordance with one embodiment of the present invention.

Exemplary embodiment(s) of the present invention is described herein in the context of a method, device, and apparatus of using a cache to improve learn rate for a content-addressable memory ("CAM").

Those of ordinary skilled in the art will realize that the following detailed description of the exemplary embodiment (s) is illustrative only and is not intended to be in any way limiting. Other embodiments will readily suggest themselves to such skilled persons having the benefit of this disclosure. Reference will now be made in detail to implementations of the exemplary embodiment(s) as illustrated in the accompanying drawings. The same reference indicators will be used throughout the drawings and the following detailed description to refer to the same or like parts.

In the interest of clarity, not all of the routine features of the implementations described herein are shown and described. It will, of course, be understood that in the development of any such actual implementation, numerous implementation-specific decisions may be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skilled in the art having the benefit of this disclosure.

In accordance with the embodiment(s) of the present invention, the components, process steps, and/or data structures described herein may be implemented using various types of operating systems, computing platforms, computer programs, and/or general purpose machines. In addition, those of ordinary skill in the art will recognize that devices of a less general purpose nature, such as hardwired devices, field programmable gate arrays (FPGAs), application specific integrated circuits (ASICs), or the like, may also be used without departing from the scope and spirit of the exemplary embodiment(s) of inventive concepts disclosed herein. Where a method including a series of process steps is implemented by a computer or a machine and those process steps can be stored as a series of instructions readable by the machine, they may be stored on a tangible medium such as a computer memory device (e.g., ROM (Read Only Memory), PROM (Programmable Read Only Memory), EEPROM (Electrically Erasable Programmable Read Only Memory), FLASH Memory, Jump Drive, and the like), magnetic storage medium (e.g., tape, magnetic disk drive, and the like), optical storage medium (e.g., CD-ROM, DVD-ROM, paper card and paper tape, and the like) and other known types of program memory.

An apparatus and method of using a cache to improve a learn rate for a content-addressable memory ("CAM") are disclosed. A network device such as a network router or switch includes a key generator, a searching circuit, and a key cache, wherein the key generator is capable of generating a first lookup key in response to a first packet. While the searching circuit is configured to search the content of CAM to match the lookup key, the key cache is capable of storing the first lookup key in response to a first miss. The signal of the first miss indicates that CAM does not have a result for the first lookup key.

The network device, in one embodiment, further includes a comparing circuit and a learn circuit. After generating a second lookup key in accordance with a second packet, the comparing circuit, for example, compares the first lookup key stored in the cache and the second lookup key in response to a second miss. When the content of the key cache does not match with the second lookup key, the learn circuit issues a search and learn ("S&L") command for establishing an entry in CAM for the second lookup key.

FIG. 1 is a block diagram 100 illustrating network routing devices using caches to improve CAM learn rate in accordance with one embodiment of the present invention. Diagram 100 includes a communications network 102, a set of network routers 103, and down stream hosts 109. Down stream hosts 109, in one example, can be any types of network capable devices, such as optical converters, routers, switches, servers, printers, computers, and/or a combination of routers, servers, and computers. It should be noted that the underlying concept of the exemplary embodiment(s) of the present invention would not change if one or more blocks (circuit or circuitries) were added to or removed from diagram 100.

Network routers 103 include multiple routers, switchers, and/or packet processing devices 104-106. Each device 104 or 106 includes an on-chip cache 108, which, for example, is used to enhance CAM learn rate and reduces packet(s) dropping. A function of a network router is to receive a packet from a source and redirect the received packet to a destination via an achievable and/or efficient path or output port. While a router may use one Internet Protocol ("IP") address at its input ports, it may use a different IP address at its output ports. As shown in FIG. 1, the IP address, for example, for the input ports of device 104 is 66.88.02, and the IP address for the output ports of device 104 is 199.188.0.5. Router, in one embodiment, is also capable of communicating with other routers. For example, routing device 104 may be configured to communicate with device 106. It should be further noted that routers or devices 104-106 may also be able to convert optical signals to electrical signals and vice versa.

Down stream hosts 109 further include multiple network capable devices 110-120 connected to router 104 via connections 140-149. It should be noted that each host has a unique IP address. For example, the IP address for device 110 is 199.188.0.6, while the IP address for device 112 is 199.188.0.8. Devices 110-120 can be any types of network capable devices, such as servers, computers, switches, routers, printers, fax machines, and the like.

Each router or packet processing device 104 or 106 has multiple input ports and multiple output ports. Packets travel from a source to one or more destinations across one or more networks. A portion of each packet such as the header of a packet indicates where the packet comes from and where it goes and what type of data it carries. For example, after extracting and reading the header of a packet, the router forwards or redirects received packet(s) to one or more of its output ports based on the information in the header. The header may be organized into several fields, which include fields for destination address, source address, packet type, quality of services ("QoS"), number of hops, length of payload, and the like.

In operation, after reading the header of a packet, the router determines whether to forward the packet or drop the packet based on the content of the header. For example, the packet may be dropped if its parameter(s) matches with previously identified spam parameter(s). If the packet is allowed to go forward, the router subsequently determines which output port(s) should be used to forward the packet. In one embodiment, router 104 is required to convert data from one data format to another data format. For example, a router may receive optical signals over an optical cable, and subsequently, forward electrical signals to one or more destinations over copper cables after a conversion from optical signals to electrical signals. It should be noted that a router may be required to process a received packet before it can be forwarded because, for example, the packet transmission media at the receiving end may have different network transmission standards than the packet transmission media at the outputting end. For example, optical transmission media may have different noise tolerance and data capacity than the electrical transmission media. As such, packets may be rearranged and/or chopped before they can be forwarded.

To enhance line rate at a high speed information transmission, a classification lookup table is used to assist routing the packet(s) from input ports to output ports. The classification lookup table includes multiple entries storing predefined results in accordance with the header values. In one embodiment, the classification lookup table uses a CAM to match a packet with a result, which indicates how to route the packet. It should be noted that CAM can be continuously updated or learned since various network devices (or hosts) can be removed from or added to the network constantly. In one embodiment, router 104 or 106 uses an on-chip cache 108 to improve the CAM learning throughput.

Figure 2:
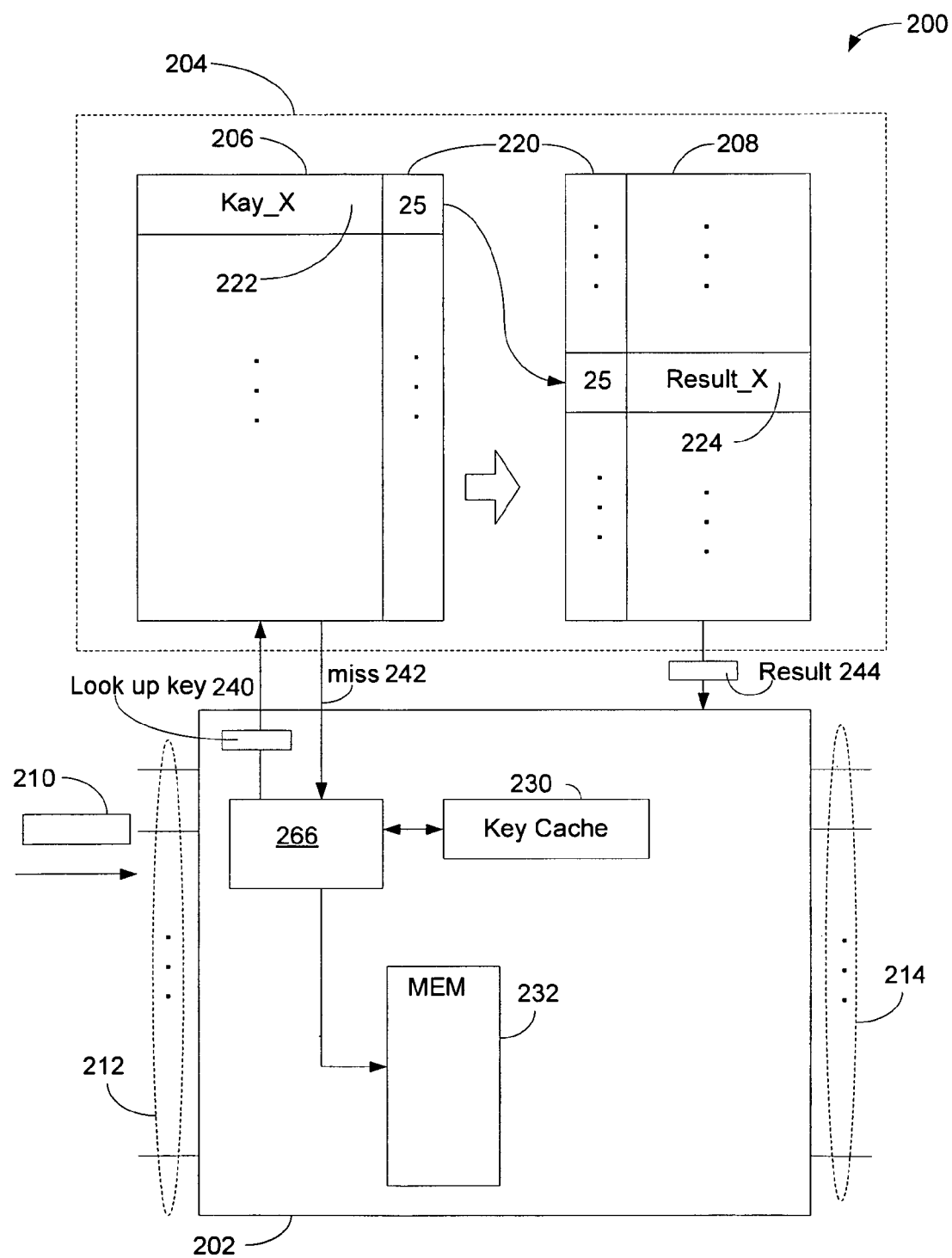
FIG. 2 is a logic block diagram illustrating a routing having a CAM and a key cache in accordance with one embodiment of the present invention.

FIG. 2 is a logic block diagram 200 illustrating a router having a CAM and a key cache in accordance with one embodiment of the present invention. Diagram 200 includes a router 202, a classification lookup table 204, and a packet 210. Router 202 further includes a set of input ports 212 and output ports 214. It should be noted that the underlying concept of the exemplary embodiment(s) of the present invention would not change if one or more blocks (circuit or circuitries) were added to or removed from diagram 200. It should be further noted that router 202 may be used in various network interfaces such as an interface between an electrical communications network and a synchronous optical network ("SONET").

Router 202 can be a network switch, a network converter, and/or a packet processing device. A function of router 202 is to route a high-speed network data packet to an appropriate destination within a defined line rate. Line rate is a speed of data stream or packets arriving at a location of a network. To process the packets at the line rate, router 202 is required to route packets at the same or substantially same speed as the packets arrive. To route and/or process each packet correctly and efficiently, router 202 may perform various packet processing procedures such as packet classification, packet traffic management, packet editing, packet scheduling, packet switching, and the like. In one embodiment, router 202 is also capable of performing data conversions, such as generating electrical signals in accordance with optical signals.

Each packet 210 includes a head portion and a data portion. The head portion, also known as header, refers to additional information located at the beginning of a packet, which includes information relating to how the packet should be forwarded. For example, the header may include source address, destination address, payload type, quality of service ("QoS"), and payload length indicator. The data portion, also known as payload, refers to data block, which may be audio information, video information, data, or a combination of audio, video and data. The length of the payload is indicated by the payload length indicator of the header. Router 202, in one embodiment, is configured to forward the packet in accordance with the information contained in the header.

Packet classification, as described earlier, is to categorize a packet or packets according to a set of predefined rules. Traffic management, on the other hand, determines whether the packet should be forwarded or dropped. For example, if a blocking parameter of a firewall matches with the parameter specified in the packet, the packet may be blocked. Packets may also be modified or edited. For example, if the bandwidth of a packet exceeds the bandwidth of an output port, the packet may be modified before it can be transmitted. Packet scheduling identifies when the packet should be sent and packet shaping prevents packets bursting phenomenon. It should be noted that the packet modification, packet scheduling, packet shaping, et cetera, may be obtained based on the packet classification.

To process packets in a high speed line rate, router 202 employs a classification lookup table 204, wherein table 204 includes multiple entries wherein each entry contains a result for a packet. Results, which are predefined stored data, indicate how to handle certain packets in response to packet handling information. Packet handling information includes packet classification, packet modification, and packet scheduling. In one embodiment, the results are accessible via indexes, wherein indexes are identified by keys. A key, in one embodiment, is generated in response to information contained in the header. Using a lookup table 204 enhances the speed of line rate without loss of packets.

Router 202 further includes a key generator 266 and a key cache 230 wherein generator 266 is configured to provide a lookup key according to the head value in the header of a packet. The lookup key is subsequently used to compare the content of each entry of classification lookup table 204 until a match is found. If, however, the match is not found, table 204 issues a miss to indicate that the packet is new and new entry(s) may be required in CAM.

Key cache 230 is a cache, which is used to prevent potential duplicating entries created in table 204 during a search and learn ("S&L") process. Key cache 230, in one embodiment, is a shift register, which resets its content after a number of predefined clock cycles. Cache 230 may further include a compare logic, which is used to compare a newly arrived lookup key with the content or keys stored in cache 230. Router 202 optionally includes a memory 232, which provides temporary storage space for implementing new packets. It should be noted that the temporary storage space can also be located in table 204. It should be further noted that on-chip caching 230 of CAM learn entries can be structured in a combination of CAM/FIFO (first-in-first-out) configuration.

Table 204, in one embodiment, includes a CAM 206 and a result memory 208 wherein CAM 206 further includes entries for storing keys 222 and index 220. Result memory 208 contains various entries for storing results 224 and index 220, as indicated by FIG. 2. It should be noted that table 204 can be located either inside or outside router 202. It should be further noted that generator 266, key cache 230, and table 204 may be integrated into one single chip to enhance device performance.

To enhance CAM learn speed, a technique of hardware-assisted learning process may be used to speed up the learning process. When a new 'flow' is detected by a router (as a 'miss' during a CAM access), hardware attempts to 'learn' the new flow by adding a new CAM entry itself without waiting for the routing software. Hardware performs this operation by issuing a 'CAM learn request' command to the CAM, which will automatically create a new entry within the CAM. Hardware-assisted learning process can enable the router to handle packets at higher speeds.

In operation, upon receipt of packet 210 from input port 212, generator 266 generates a lookup key 240 and passes key 240 to table 204. Table 204 searches the content of CAM 206 to identify whether any of stored keys in CAM 206 matches with key 240. If key 240 is found in an entry of CAM 206, table 204 identifies a corresponding result in memory 208 using indexes 220. For example, if key 240 is found in key_x 222 of CAM 206, table 204 subsequently identifies result_X 224 in memory 208 using a corresponding index 25. Upon retrieving a result 244 from an entry of result memory 208, result 244 is then forwarded to router 202. Router 202 routes packet 210 in accordance with result 244. If however, key 240 is not found in CAM 206, table 204 issues a signal of miss 242. Upon acknowledging of miss 242, router 202 searches key cache 230 to determine whether key 240 is stored in cache 230. If key 240 is not found in cache 230, which indicates that it is a new packet, router 202 stores key 240 in cache 230 and issues a search and learn ("S&L") request, which instructs the system to update table 204 for packet 210. Router 202 uses temporary memory space 232 to handle packet 240. As described earlier, temporary memory space 232 could be located in table 204. If, however, key 240 is found in cache 230, key 240 will not be stored in cache 230 and S&L request for key 240 will be suppressed. As such, the duplicating entries in CAM for key 240 are substantially reduced.

Key cache 230, in one embodiment, is implemented in an on-chip cache to ensure keys are written once in the CAM upon initiation of Search & Learn(S&L) commands. Key cache 230 is treated as a CAM lookup table for S&L requests and as a FIFO for caching newly learned keys. S&L requests that result in new index being learned and written into CAM 206 get pushed onto key cache 230. Entries in key cache 230 are popped off after the last CAM write for learning the new entry is completed. Since there is a feedback loop for popping/invalidating entries in key cache 230, no duplicated learning occurs or duplicated learning process is reduced. S&L requests are, for example, dropped if there are no more free learn indexes or key cache 230 is full. The size of key cache 230 can be set based on the maximum expected burst size of learn commands. As such, adding an on-chip learn cache improves efficiency and increases learn rate.

Figure 3:
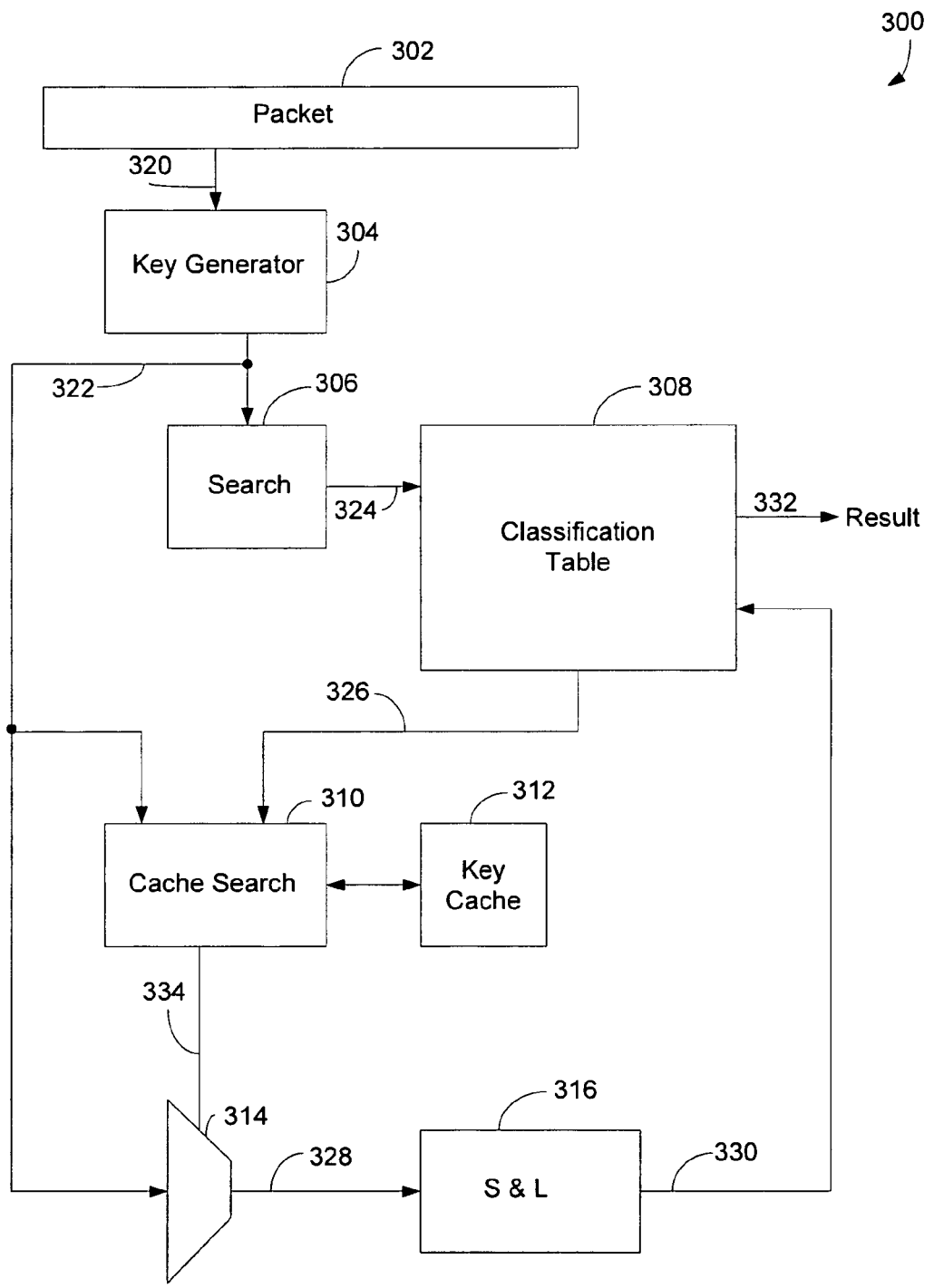
FIG. 3 is a logic block diagram illustrating a network router switch using a cache in accordance with one embodiment of the present invention.

FIG. 3 is a logic block diagram 300 illustrating a router using a cache in accordance with one embodiment of the present invention. Diagram 300 includes a packet 302, a key generator 304, a search unit 306, a classification table 308, and a key cache 312. It should be noted that the underlying concept of the exemplary embodiment(s) of the present invention would not change if one or more blocks (circuit or circuitries) were added to or removed from diagram 300.

Diagram 300 shows logic data flow for a routing device using a key cache 312 to prevent duplication of the same key entries in classification table 308. Upon receipt of packet 302 via a connection 320, key generator 304 generates a key value, which is subsequently sent to search unit 306 and cache search unit 310 via a connection 322. If search unit 306 locates a key value in table 308 via a connection 324, table 308 provides a result to the router via 332 regarding how to handle packet 302. If search unit 306 fails to find a match in table 308, table 308 issues a miss, which triggers a key cache search via a connection 326. If the key value is found in key cache 312, cache search 310 deactivates gate circuit 314 via 334. If gate circuit 314 is deactivated, an S&L request 316 for the key value will be suppressed. Alternatively, if the key value is not found in key cache 312, the key value is saved in key cache 312 and gate circuit 314 is activated via connection 334. When gate circuit 314 is activated, an S&L request 316 in accordance with the key value from connection 322 is issued via a connection 330. When table 308 acknowledges S&L request 316, table 308 is updated to create new entry or entries for the key value.

It should be noted that when table 308 issues a miss, internal processor or system software creates an entry or add a new result to table 308 after calculation in accordance with the head information of packet 302. Processor (or software) performs learn process and enters a result in the CAM according to the packet, so that when the same packet arrives next time, the router will be able to find the result for the packet in table 308. It should be noted that if the learn rate is the same or substantially the same as the line rate, no packets will be dropped.

The exemplary embodiment of the present invention includes various processing steps, which will be described below. The steps of the embodiment may be embodied in machine or computer executable instructions. The instructions can be used to cause a general purpose or special purpose system, which is programmed with the instructions, to perform the steps of the exemplary embodiment of the present invention. Alternatively, the steps of the exemplary embodiment of the present invention may be performed by specific hardware components that contain hard-wired logic for performing the steps, or by any combination of programmed computer components and custom hardware components. While embodiments of the present invention will be described with reference to the optical communications network, the method and apparatus described herein are equally applicable to other network infrastructures or other data communications environments.

Figure 4:
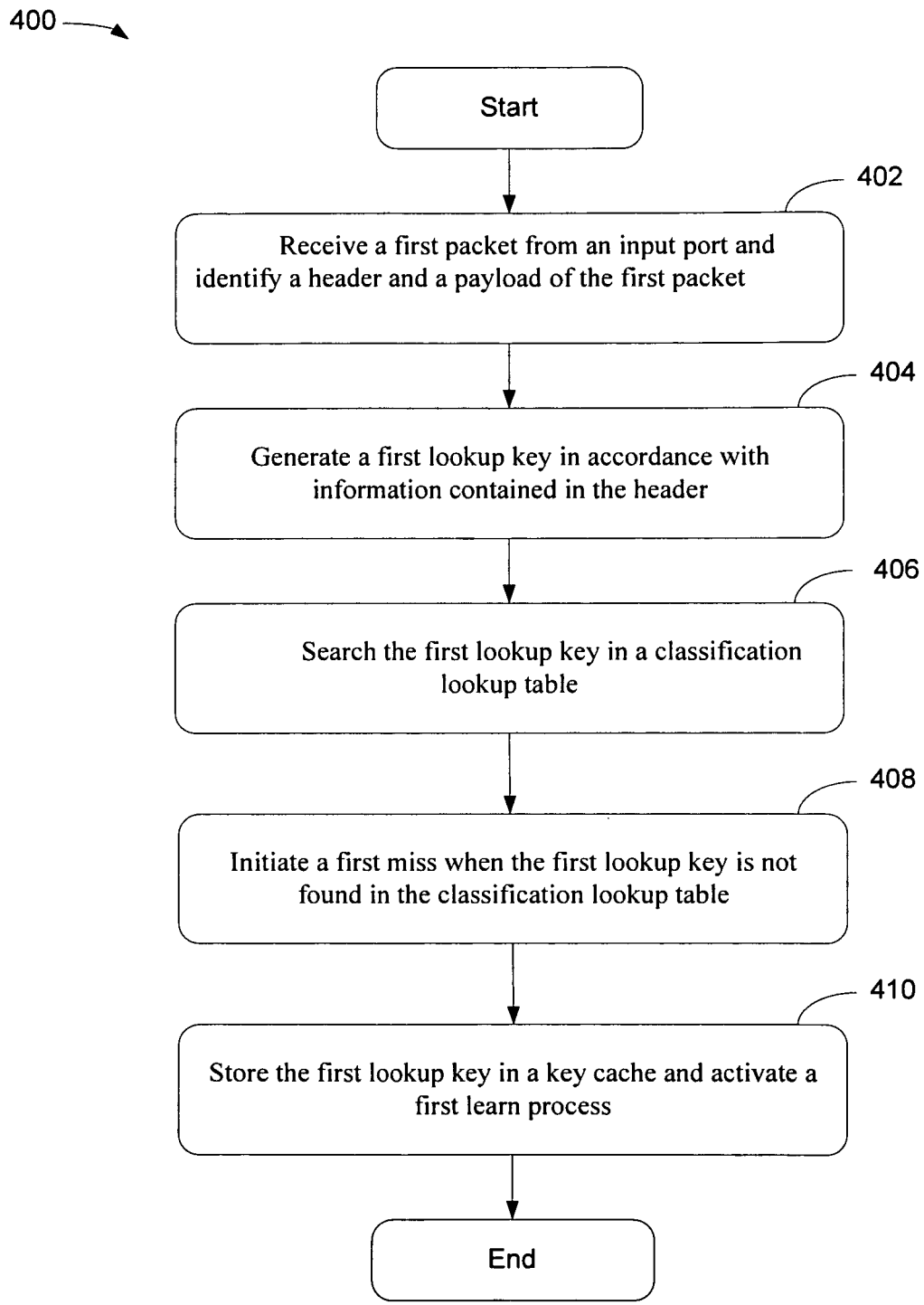
FIG. 4 is a flowchart illustrating a process of initiating a search and learn mechanism using a key cache in accordance with one embodiment of the present invention.

FIG. 4 is a flowchart 400 illustrating a process of initiating a search and learn mechanism using a key cache in accordance with one embodiment of the present invention. At block 402, a process receives a first packet from an input port and identifies a header and a payload of the first packet. The first packet may carry voice, video, data, or a combination of voice, video and data. After block 402, the process proceeds to the next block.

At block 404, the process generates a first lookup key in accordance with information contained in the header. The header, for example, may include a source address, a destination address, QoS, and data type. After block 404, the process proceeds to the next block.

At block 406, the process searches the first lookup key in a classification lookup table. In one embodiment, content stored in each entry of the classification lookup table is searched and compared against the first lookup key to determine whether the classification lookup table contains the first lookup key. The classification lookup table, in one example, is located on the same chip. Alternatively, the classification lookup table is located on another chip. After block 406, the process moves to the next block.

At block 408, the process initiates a first miss when the first lookup key is not found in the classification lookup table. Upon acknowledging the first miss, software of the system begins to establish an entry in the classification lookup table for the first lookup key. After block 408, the process proceeds to the next block.

At block 410, the process stores the first lookup key in a key cache and activates a first learning process for the first lookup key to update the classification lookup table. Upon receipt of a second packet from the input port and identifying a header and a payload of the second packet, the process generates a second lookup key in accordance with information contained in the header of the second packet. After searching the second lookup key in the classification lookup table, the process initiates a second miss when the second lookup key is not found in the classification lookup table. The second lookup key is subsequently searched in the key cache in response to the second miss. The process activates a second learn process for the second lookup key if the second lookup key is not found in the key cache. Alternatively, the process suppresses or prevents a second learn process for the second lookup key if the second lookup key is found in the key cache. The process, in one embodiment, stores the first lookup key in an on-chip temporary learn table for classifying the first packet while a new entry for the first lookup key is being updated in the classification lookup table. The process further pushes the first lookup key into a key cache, which may be a first-in-first-out shifting register. After block 410, the process ends.

While particular embodiments of the present invention have been shown and described, it will be obvious to those skilled in the art that, based upon the teachings herein, changes and modifications may be made without departing from this exemplary embodiment(s) of the present invention and its broader aspects. Therefore, the appended claims are intended to encompass within their scope all such changes and modifications as are within the true spirit and scope of this exemplary embodiment(s) of the present invention.

What is claimed is:

1. A network device comprising:
   a key generator capable of generating a first lookup key in response to a first packet;

a searching circuit coupled to the key generator and configured to search content of a content-addressable memory ("CAM") to match the first lookup key;

a key cache coupled to the searching circuit and capable of storing the first lookup key in response to a first miss generated by the searching circuit when the content of the CAM does not match with the first lookup key; and a comparing circuit coupled to the key cache and configured to compare the first lookup key stored in the key cache with a second lookup key, which is generated in accordance with a second packet in response to a second miss.

2. The device of claim 1, wherein the searching circuit generates a first miss if the first lookup key is not found in the CAM; and wherein the searching circuit generates the second miss if the second lookup key is not found in the CAM.

3. The device of claim 2, further comprising a learn circuit coupled to the comparing circuit and configured to issue a search and learn ("S&L") command for the second lookup key when content of the key cache does not match with the second lookup key.

4. The device of claim 3, wherein the learn circuit suppresses the S&L command for the second lookup key when the first lookup key stored in the key cache matches with the second lookup key.

5. The device of claim 1, wherein the key generator is capable of extracting multiple fields from a header of the first packet and generating the first lookup key in accordance with the multiple fields.

6. The device of claim 1, wherein the key cache is constructed in a first-in-first-out ("FIFO") configuration, wherein data stored in the FIFO shifts through the FIFO.

7. The device of claim 1, further comprising an on-chip learn table coupled to the key generator and configured to facilitate temporary packet classification until an entry of a new lookup key is established in the CAM.

8. The device of claim 1, wherein the key cache is a shift register, wherein the shift register shifts the first lookup key through the shift register in accordance with a predefined clock cycle.

9. A routing device capable of processing network data packets comprising the device of claim 1.

10. A method of processing data packets, comprising:
receiving a first packet from an input port and identifying a header and a payload of the first packet;
generating a first lookup key in accordance with information contained in the header;
searching the first lookup key in a classification lookup table;
initiating a first miss when the first lookup key is not found in the classification lookup table;
comparing the first lookup key with content stored in a key cache; and
storing the first lookup key in the key cache if the first lookup key is not found in the key cache and activating a first learning process for the first lookup key to update the classification lookup table.

11. The method of claim 10, further comprising:
receiving a second packet from the input port and identifying a header and a payload of the second packet;
generating a second lookup key in accordance with information contained in the header of the second packet;
searching the second lookup key in the classification lookup table;
initiating a second miss when the second lookup key is not found in the classification lookup table; and
searching the second lookup key in the key cache in response to the second miss.

12. The method of claim 11, further comprising activating a second learn process for the second lookup key if the second lookup key is not found in the key cache.

13. The method of claim 12, further comprising suppressing a second learn process for the second lookup key if the second lookup key is found in the key cache.

14. The method of claim 10, wherein generating a first lookup key in accordance with information contained in the header further includes identifying a source address, a destination address, and data type.

15. The method of claim 10, further comprising storing the first lookup key in a on-chip temporary learn table for classifying the first packet while an entry for the first lookup key is being updated in the classification lookup table.

16. The method of claim 10, wherein storing the first lookup key in a key cache includes pushing the first lookup key into a first-in-first-out shifting register.

17. An apparatus for processing data packets, comprising:
means for receiving a first packet from an input port and means for identifying a header and a payload of the first packet;
means for generating a first lookup key in accordance with information contained in the header;
means for searching the first lookup key in a classification lookup table;
means for initiating a first miss when the first lookup key is not found in the classification lookup table;
means for comparing the first lookup key with content stored in a key cache; and
means for storing the first lookup key in the key cache if the first lookup key is not found in the key cache and activating a first learning process for the first lookup key to update the classification lookup table.

18. The apparatus of claim 17, further comprising:
means for receiving a second packet from the input port and means for identifying a header and a payload of the second packet;
means for generating a second lookup key in accordance with information contained in the header of the second packet;
means for searching the second lookup key in the classification lookup table;
means for initiating a second miss when the second lookup key is not found in the classification lookup table; and
means for searching the second lookup key in the key cache in response to the second miss.

19. The apparatus of claim 18, further comprising means for activating a second learn process for the second lookup key if the second lookup key is not found in the key cache.

20. The apparatus of claim 19, further comprising means for suppressing a second learn process for the second lookup key if the second lookup key is found in the key cache.

* * * * *